United States Patent
Yang et al.

(10) Patent No.: US 12,396,131 B2
(45) Date of Patent: Aug. 19, 2025

(54) TWO-PHASE IMMERSION-COOLING HEAT-DISSIPATION STRUCTURE HAVING SHORTENED EVACUATION ROUTE FOR VAPOR BUBBLES

(71) Applicant: AMULAIRE THERMAL TECHNOLOGY, INC., New Taipei (TW)

(72) Inventors: Ching-Ming Yang, New Taipei (TW); Chun-Te Wu, New Taipei (TW); Yu-Wei Chiu, New Taipei (TW); Tze-Yang Yeh, New Taipei (TW)

(73) Assignee: AMULAIRE THERMAL TECHNOLOGY, INC., New Taipei (TW)

( * ) Notice: Subject to any disclaimer, the term of this patent is extended or adjusted under 35 U.S.C. 154(b) by 314 days.

(21) Appl. No.: 18/108,058

(22) Filed: Feb. 10, 2023

(65) Prior Publication Data
US 2024/0276676 A1    Aug. 15, 2024

(51) Int. Cl.
H05K 7/20    (2006.01)
(52) U.S. Cl.
CPC ......... H05K 7/203 (2013.01); H05K 7/20809 (2013.01)
(58) Field of Classification Search
CPC .... H05K 7/20809; H05K 7/203; H01L 23/44; F28D 2021/0028
See application file for complete search history.

(56) References Cited

U.S. PATENT DOCUMENTS

| | | | |
|---|---|---|---|
| 12,050,061 B2 * | 7/2024 | Kang | H01L 23/3733 |
| 2013/0258595 A1 * | 10/2013 | Tuckerman | H05K 7/20372 |
| | | | 165/104.11 |
| 2015/0062806 A1 * | 3/2015 | Shelnutt | H05K 7/20318 |
| | | | 361/679.53 |

FOREIGN PATENT DOCUMENTS

| | | | | |
|---|---|---|---|---|
| DE | 102018127140 A1 * | 6/2019 | | H01L 21/02532 |
| TW | M634899 U | 12/2022 | | |

OTHER PUBLICATIONS

Pdf is translation of foreign reference DE-102018127140-A1 (Year: 2019).*

* cited by examiner

*Primary Examiner* — Len Tran
*Assistant Examiner* — Kamran Tavakoldavani
(74) *Attorney, Agent, or Firm* — Li & Cai Intellectual Property (USA) Office

(57) ABSTRACT

A two-phase immersion-cooling heat-dissipation structure having shortened evacuation route for vapor bubbles includes an immersion-cooling substrate having a first surface and a second surface that are opposite to each other and immersion-cooling fins. The second surface contacts a heat source immersed in a two-phase coolant, and the first surface connects to the immersion-cooling fins. The immersion-cooling fins include at least one skived fin integrally formed on the first surface of the immersion-cooling substrate by skiving, and further include at least one functional fin. The functional fin is a single continuous fin extends lengthwise in a vapor bubbles evacuation direction, has a central portion corresponding in position to the heat source and upper and lower end portions located away from the heat source, and a height of the central portion is greater than at least one of a height of the upper and lower end portions.

8 Claims, 4 Drawing Sheets

TWO-PHASE IMMERSION-COOLING HEAT-DISSIPATION STRUCTURE HAVING SHORTENED EVACUATION ROUTE FOR VAPOR BUBBLES

FIELD OF THE DISCLOSURE

The present disclosure relates to a heating-dissipation structure, and more particularly to a two-phase immersion-cooling heat-dissipation structure having shortened evacuation route for vapor bubbles.

BACKGROUND OF THE DISCLOSURE

A two-phase immersion-cooling technology is to directly immerse heat sources such as server motherboards, disk arrays, etc. in a non-conductive two-phase coolant, and heat generated by the operation of the heat-generating component is removed through an endothermic gasification process of the two-phase coolant. Therefore, how to dissipate heat more effectively through the two-phase immersion-cooling technology has long been an issue to be addressed in the industry.

SUMMARY OF THE DISCLOSURE

In response to the above-referenced technical inadequacies, the present disclosure provides a two-phase immersion-cooling heat-dissipation structure having shortened evacuation route for vapor bubbles.

In one aspect, the present disclosure provides a two-phase immersion-cooling heat-dissipation structure having shortened evacuation route for vapor bubbles. The two-phase immersion-cooling heat-dissipation structure includes an immersion-cooling substrate and a plurality of immersion-cooling fins. The immersion-cooling substrate has a first surface and a second surface that are opposite to each other, the second surface is used for contacting a heat source immersed in a two-phase coolant, and the first surface is connected with the plurality of immersion-cooling fins. The plurality of immersion-cooling fins include at least one skived fin integrally formed on the first surface of the immersion-cooling substrate by skiving. The plurality of immersion-cooling fins further include at least one functional fin, the functional fin is a single continuous fin extends lengthwise in a vapor bubbles evacuation direction, the functional fin has a central portion corresponding in position to the heat source and an upper end portion and a lower end portion away from the heat source, and a height of the central portion is greater than at least one of a height of the upper end portion and a height of the lower end portion.

In certain embodiments, a thickness of any one of the plurality of immersion-cooling fins ranges from 0.1 mm to 0.35 mm, a height of any one of the plurality of immersion-cooling fins ranges from 5 mm to 10 mm, and a gap between any two adjacent ones of the plurality of immersion-cooling fins ranges from 0.1 mm to 0.35 mm.

In certain embodiments, a gap between at least two adjacent ones of the plurality of immersion-cooling fins is different from a gap between another two adjacent ones of the plurality of immersion-cooling fins.

In certain embodiments, the plurality of immersion-cooling fins are made of copper or copper alloy.

In certain embodiments, a surface roughness (Ra) of each of the plurality of immersion-cooling fins is greater than 1.5 μm.

In certain embodiments, an upper slope that gradually decreases in height from bottom to top is formed on the upper end portion of the at least one functional fin, and a lower slope that gradually decreases in height from top to bottom is formed on the lower end portion of the at least one functional fin.

In certain embodiments, the two-phase immersion-cooling heat-dissipation structure further includes: a reinforcement outer frame bonded to the immersion-cooling substrate and surrounding at least a portion of the plurality of immersion-cooling fins.

In certain embodiments, a plurality of through holes are formed on at least one of the immersion-cooling substrate and the reinforcement outer frame and a plurality of spring screws are threaded through the plurality of through holes, respectively.

In certain embodiments, the two-phase immersion-cooling heat-dissipation structure further includes: a highly thermally conductive structure attached to the second surface of the immersion-cooling substrate, such that the immersion-cooling substrate forms an indirect contact with the heat source through the highly thermally conductive structure, and wherein a vacuum airtight cavity is formed inside the highly thermally conductive structure, and the vacuum airtight cavity contains liquid.

These and other aspects of the present disclosure will become apparent from the following description of the embodiment taken in conjunction with the following drawings and their captions, although variations and modifications therein may be affected without departing from the spirit and scope of the novel concepts of the disclosure.

BRIEF DESCRIPTION OF THE DRAWINGS

The described embodiments may be better understood by reference to the following description and the accompanying drawings, in which.

DETAILED DESCRIPTION OF THE EXEMPLARY EMBODIMENTS

Figure 1:
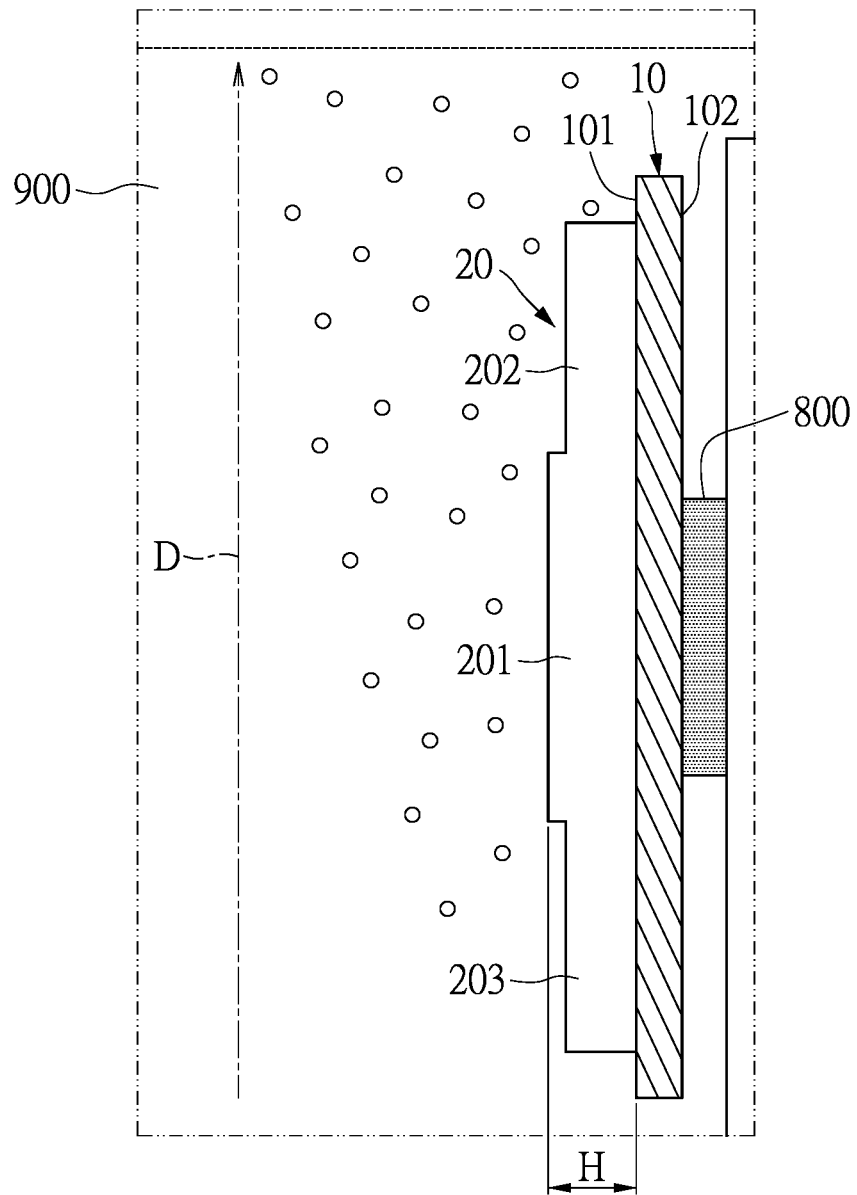
FIG. 1 is a schematic side view according to a first embodiment of the present disclosure.

The present disclosure is more particularly described in the following examples that are intended as illustrative only since numerous modifications and variations therein will be apparent to those skilled in the art. Like numbers in the drawings indicate like components throughout the views. As used in the description herein and throughout the claims that follow, unless the context clearly dictates otherwise, the meaning of "a", "an", and "the" includes plural reference, and the meaning of "in" includes "in" and "on". Titles or subtitles can be used herein for the convenience of a reader, which shall have no influence on the scope of the present disclosure.

The terms used herein generally have their ordinary meanings in the art. In the case of conflict, the present document, including any definitions given herein, will prevail. The same thing can be expressed in more than one way. Alternative language and synonyms can be used for any term(s) discussed herein, and no special significance is to be placed upon whether a term is elaborated or discussed herein. A recital of one or more synonyms does not exclude the use of other synonyms. The use of examples anywhere in this specification including examples of any terms is illustrative only, and in no way limits the scope and meaning of the present disclosure or of any exemplified term. Likewise, the present disclosure is not limited to various embodiments given herein. Numbering terms such as "first", "second" or "third" can be used to describe various components, signals or the like, which are for distinguishing one component/signal from another one only, and are not intended to, nor should be construed to impose any substantive limitations on the components, signals or the like.

First Embodiment

Figure 2:
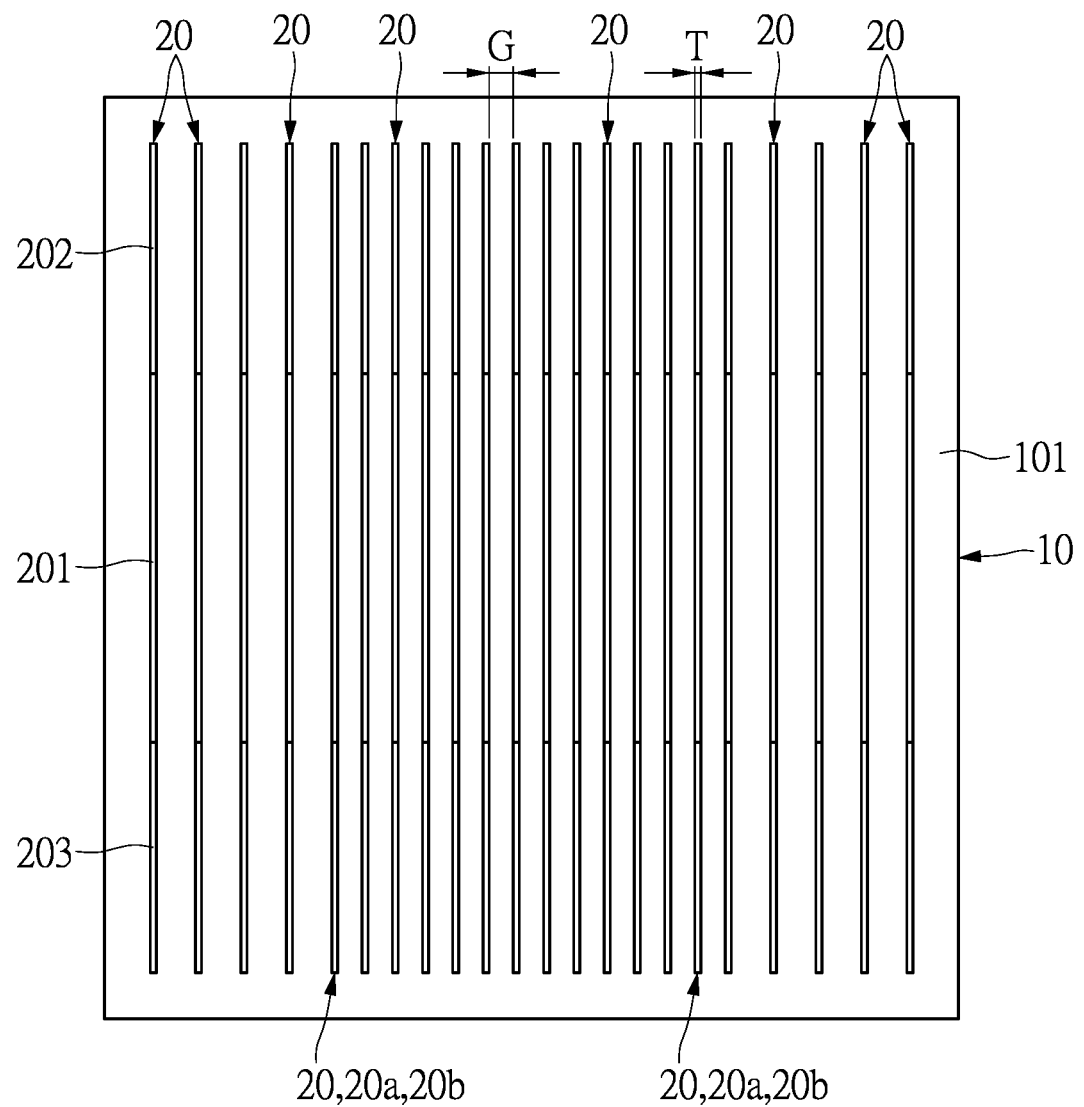
FIG. 2 is a schematic front view according to the first embodiment of the present disclosure.
Figure 3:
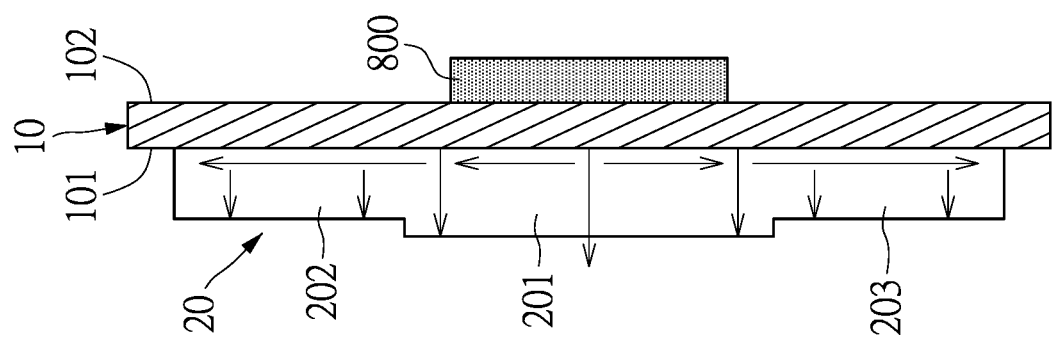
FIG. 3 is a schematic view of an evacuation route for vapor bubbles according to the first embodiment of the present disclosure.

Reference is made to FIG. 1 to FIG. 3, in which a first embodiment of the present disclosure provides a two-phase immersion-cooling heat-dissipation structure having shortened evacuation route for vapor bubbles that is used for contacting a heat source immersed in a two-phase coolant. As shown in the figures, the two-phase immersion-cooling heat-dissipation structure having shortened evacuation route for vapor bubbles according to the first embodiment of the present disclosure includes an immersion-cooling substrate 10 and a plurality of immersion-cooling fins 20.

In the first embodiment, the immersion-cooling substrate 10 can be made of highly thermally conductive materials, such as aluminum, copper or copper alloy. The immersion-cooling substrate 10 can be a non-porous heat dissipation material or a porous heat dissipation material. Preferably, the immersion-cooling substrate 10 can be a porous metal heat sink having porosity greater than 8% immersed in a two-phase coolant 900 (e.g., FLUORINERT™ that is electrically non-conductive), and can be used to increase a generation of vapor bubbles to improve the immersion cooling effect.

In the first embodiment, the immersion-cooling substrate 10 has a first surface 101 and a second surface 102 that are opposite to each other. The second surface 102 is used for contacting a heat source 800 immersed in the two-phase coolant 900, and the second surface 102 can be directly in contact with the heat source 800 or indirectly through an intermediate layer.

The first surface 101 of the immersion-cooling substrate 10 is connected with the plurality of immersion-cooling fins 20, and the plurality of immersion-cooling fins 20 include at least one skived fin 20a integrally formed on the first surface 101 of the immersion-cooling substrate 10 in a skiving manner. Preferably, all of the plurality of immersion-cooling fins 20 are skived-fins 20a, such that the plurality of immersion-cooling fins 20 in a high density arrangement can obtain a greater surface area to absorb heat and enable nucleate boiling for improving the immersion-cooling effect.

The plurality of immersion-cooling fins 20 further includes at least one functional fin 20b, and the at least one functional fin 20b is a single continuous fin extends lengthwise along a vapor bubbles evacuation direction D. The vapor bubbles evacuation direction D is from bottom to top, that is, a direction opposite to the direction of gravity. The vapor bubbles escape along the vapor bubbles evacuation direction D after detaching from the at least one functional fin 20b. Preferably, each of the plurality of immersion-cooling fins 20 can be a functional fin 20b. Most preferably, each of the plurality of immersion-cooling fins 20 can be a skived fin 20a and a functional fin 20b.

Moreover, the at least one functional fin 20b has a central portion 201 corresponding to a position of the heat source 800, and an upper end portion 202 and a lower end portion 203 that are upwardly and downwardly located away from the position of the heat source 800, respectively. Moreover, a height of the central portion 201 of the at least one functional fin 20b is greater than a height of the upper end portion 202 or a height of the lower end portion 203 of the at least one functional fin 20b. In the first embodiment, the height of the central portion 201 refers to a horizontal linear distance from the first surface 101 to a highest point of the central portion 201, the height of the upper end portion 202 refers to a horizontal linear distance from the first surface 101 to a highest point of the upper end portion 202, and the height of the lower end portion 203 refers to a horizontal linear distance from the first surface 101 to a highest point of the lower end portion 203.

Since the heat source 800 is immersed in the two-phase coolant 900 for heat transfer via boiling, excess vapor bubbles generated near the heat source 800 squeeze upwards and downwards. Therefore, in the first embodiment, by the height of the central portion 201 of the at least one functional fin 20b being greater than the height of the upper end portion 202 and/or the height of the lower end portion 203 of the at least one functional fin 20b, the evacuation route for vapor bubbles in an area of the upper end portion 202 and an area of the lower end portion 203 area (as shown in FIG. 3) can be shortened to improve the bubble evacuation efficiency, thereby effectively increasing the effect of the two-phase immersion cooling.

In this embodiment, a surface roughness (Ra) of the plurality of immersion-cooling fins 20 is greater than 1.5 μm. A thickness T of the plurality of immersion-cooling fins 20 ranges from 0.1 mm to 0.35 mm, in which the thickness T refers to a central thickness of a single fin. A gap G between any two adjacent ones of the plurality of immersion-cooling fins 20 ranges from 0.1 mm to 0.35 mm, in which the gap G refers to a shortest distance between a side of one of the plurality of immersion-cooling fins 20 and a corresponding side of an adjacent one of the plurality of immersion-cooling fins 20. The gap G between the side of one of the plurality of immersion-cooling fins 20 and the corresponding side of the adjacent one of the plurality of immersion-cooling fins 20 forms a evacuating route for evacuating vapor bubbles. Furthermore, at least two adjacent ones of the plurality of immersion-cooling fins 20 have a distance G therebetween that is different from that of another two adjacent ones of the plurality of immersion-cooling fins 20. A height H of any one of the plurality of immersion-cooling fins 20 ranges from 5 mm to 10 mm, in which the height H refers to a horizontal linear distance from the first surface 101 to a highest point of the plurality of immersion-cooling fins 20.

Second Embodiment

Figure 5:
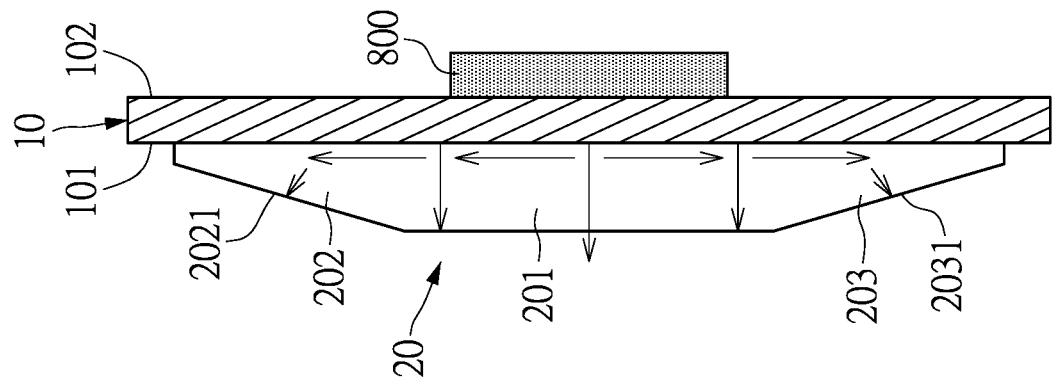
FIG. 5 is a schematic view of an evacuation route for vapor bubbles according to the second embodiment of the present disclosure.
Figure 4:
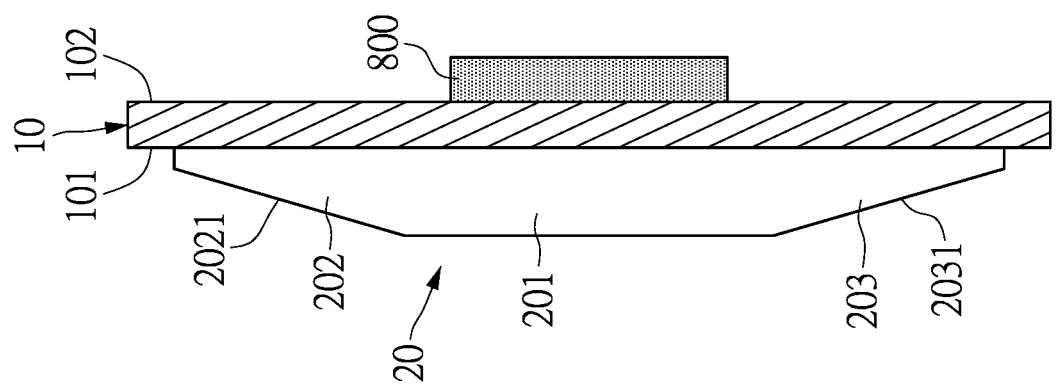
FIG. 4 is a schematic side view according to a second embodiment of the present disclosure.

Reference is made to FIG. 4 and FIG. 5, which show a second embodiment of the present disclosure. The second embodiment is substantially the same as the first embodiment, and the differences are described as follows.

In the second embodiment, an upper slope 2021 having a height that gradually decreases from bottom to top is formed on the upper end portion 202 of the at least one functional fin 20b of the plurality of immersion-cooling fins 20, and a lower slope 2031 having a height gradually decreases from top to bottom is formed on the lower end portion 203 of the at least one functional fin 20b. That is, the upper end portion 202 and the lower end portion 203 respectively have the upper slope 2021 and the lower slope 2031 formed thereon upwardly and downwardly away from the heat source 800. Therefore, in the second embodiment, in addition to that the height of the central portion 201 of the at least one functional fin 20b is greater than an average height of the upper end portion 202 and an average height of the lower end portion 203 of the at least one functional fin 20b, the upper slope 2021 and the lower slope 2031 are further formed via the at least one functional fin 20b, such that the evacuation route for vapor bubbles in the area of the upper end portion 202 and the area of the lower end portion 203 (as shown in FIG. 5) can be shortened to achieve an improved vapor bubbles evacuation efficiency, thereby more effectively increasing the effect of two-phase immersion cooling.

Third Embodiment

Figure 6:
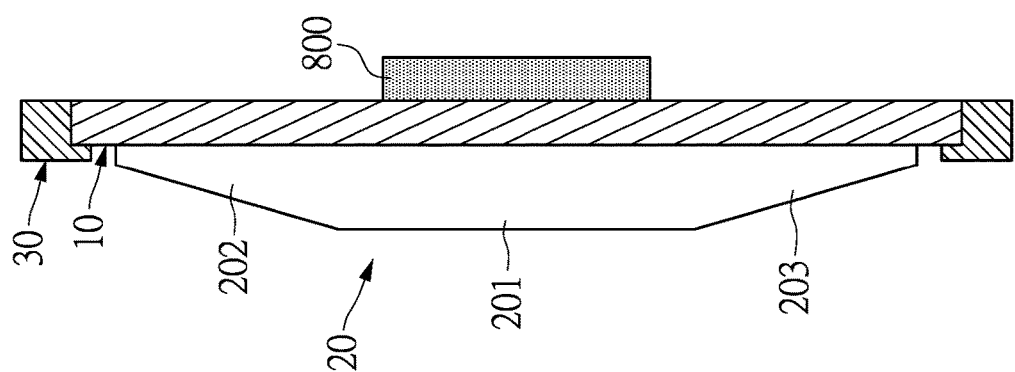
FIG. 6 is a schematic side view according to a third embodiment of the present disclosure.

Reference is made to FIG. 6, in which a third embodiment of the present disclosure is substantially the same as the first and the second embodiments above, and the differences are described as follows.

In the third embodiment, the immersion-cooling substrate 10 further has a reinforcement outer frame 30 bonded thereon, and the reinforcement outer frame 30 surrounds at least a portion of the plurality of immersion-cooling fins 20, so as to reinforce the overall structural strength and avoid problems and damage caused by warpage of the heat-dissipation structure. The reinforcement outer frame 30 can be made of aluminum alloy or stainless steel. Moreover, the reinforcement outer frame 30 may be bonded to the immersion-cooling substrate 10 by press-fitting, welding, friction stir welding (FSW), gluing, or diffusion bonding.

Fourth Embodiment

Figure 7:
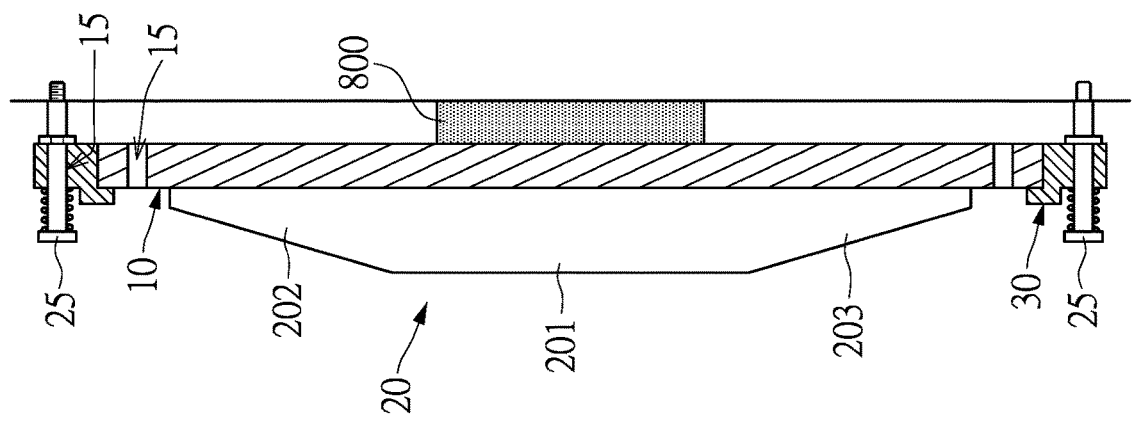
FIG. 7 is a schematic side view according to a fourth embodiment of the present disclosure.

Reference is made to FIG. 7, which shows a fourth embodiment of the present disclosure.

The fourth embodiment is substantially the same as the first, second and third embodiments, and the differences are described as follows.

In the fourth embodiment, a plurality of through holes 15 may be formed on two sides of the immersion-cooling substrate 10 or two sides of the reinforcement outer frame 30, and a plurality of spring screws 25 may be threaded to the plurality of through holes 15, respectively, so as to better fix the immersion-cooling substrate 10 or the reinforcement outer frame 30 on a mainboard that has the heat source 800.

Fifth Embodiment

Figure 8:
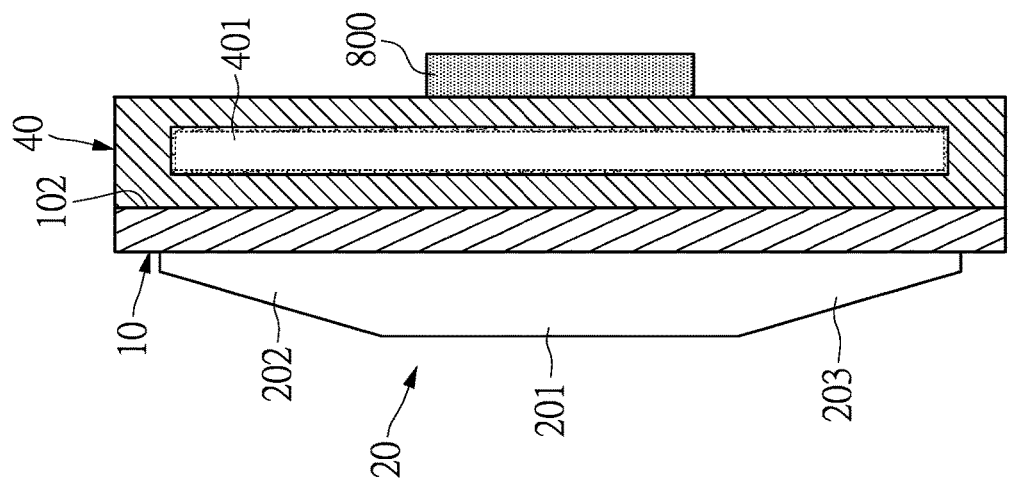
FIG. 8 is a schematic side view according to a fifth embodiment of the present disclosure.

Reference is made to FIG. 8, which show a fifth embodiment of the present disclosure.

The fifth embodiment is substantially the same as the first and second embodiments, and the differences are described as follows.

The fifth embodiment of the present disclosure further includes a highly thermally conductive structure 40. More-over, the highly thermally conductive structure 40 is attached to the second surface 102 of the immersion-cooling substrate 10, such that the immersion-cooling substrate 10 is in an indirect contact with the heat source 800 immersed in the two-phase coolant through the highly thermally conductive structure 40. More specifically, the highly thermally conductive structure 40 may be attached to the second surface 102 of the immersion-cooling substrate 10 through welding, friction stir welding, gluing, or diffusion bonding. In other embodiments, the immersion-cooling substrate 10 and the highly thermally conductive structure 40 may be integrally formed.

Furthermore, a vacuum airtight cavity 401 is formed inside the highly thermally conductive structure 40, a sintered body can also be formed on a top wall and a bottom wall of the vacuum airtight cavity 401, and the vacuum airtight cavity 401 contains an appropriate amount of liquid that may be water or acetone. Moreover, another surface of the highly thermally conductive structure 40 that is not in contact with the second surface 102 of the immersion-cooling substrate 10 can be used to contact the heat source 800 immersed in the two-phase coolant. Accordingly, heat generated by the heat source 800 immersed in the two-phase coolant can be removed through an endothermic gasification process of the two-phase coolant. In addition, the highly thermally conductive structure 40 can be in contact with the heat source 800 and absorb the heat generated thereby, so that the liquid contained in the vacuum airtight cavity 401 is gasified or vaporized into vapor and distributed to the immersion-cooling substrate 10. The heat is rapidly conducted to the skived fins that are integrally formed on the immersion-cooling substrate 10 and arranged in very high density. The heat energy absorbed by the skived fins is then removed through the endothermic gasification process of the two-phase coolant, and the vapor in the vacuum airtight cavity 401 flows back to the bottom wall of the vacuum airtight cavity 401 after transferring out the heat and being condensed on the top wall of the vacuum airtight cavity 401. By performing the loop in a high speed, heat generated by the heat source 800 can be rapidly delivered outward, thereby improving an overall immersion heat-dissipation effect.

Beneficial Effects of the Embodiments

In summary, in the two-phase immersion-cooling heat-dissipation structure having shortened evacuation route for vapor bubbles of the present disclosure, by virtue of "the immersion-cooling substrate having a first surface and a second surface that are opposite to each other, the second surface of the immersion-cooling substrate being used for contacting a heat source immersed in a two-phase coolant, and the first surface of the immersion-cooling substrate being connected with the plurality of immersion-cooling fins," "the plurality of immersion-cooling fins including at least one skived fin integrally formed on the first surface of the immersion-cooling substrate by skiving," "the plurality of immersion-cooling fins further including at least one functional fin," "the functional fin being a single continuous fin extends lengthwise in a vapor bubbles evacuation direction," and "the functional fin having a central portion corresponding in position to the heat source and an upper end portion and a lower end portion away from the heat source, and a height of the central portion being greater than that of the upper end portion and the lower end portion," an overall immersion-cooling effect can be effectively improved.

The foregoing description of the exemplary embodiments of the disclosure has been presented only for the purposes of illustration and description and is not intended to be exhaustive or to limit the disclosure to the precise forms disclosed. Many modifications and variations are possible in light of the above teaching.

The embodiments were chosen and described in order to explain the principles of the disclosure and their practical application so as to enable others skilled in the art to utilize the disclosure and various embodiments and with various modifications as are suited to the particular use contemplated. Alternative embodiments will become apparent to those skilled in the art to which the present disclosure pertains without departing from its spirit and scope.

What is claimed is:

1. A two-phase immersion-cooling heat-dissipation structure having shortened evacuation route for vapor bubbles, comprising:
    an immersion-cooling substrate having a first surface and a second surface that are opposite to each other, wherein the second surface is used for contacting a heat source that is immersed in a two-phase coolant; and
    a plurality of immersion-cooling fins, wherein the first surface is connected with the plurality of immersion-cooling fins, the plurality of immersion-cooling fins include at least one fin integrally formed on the first surface of the immersion-cooling substrate, and the plurality of immersion-cooling fins further include at least one functional fin;
    wherein the at least one functional fin is a single continuous fin that extends lengthwise in a vapor bubbles evacuation direction, the at least one functional fin has a central portion corresponding in position to the heat source and an upper end portion and a lower end portion that are away from the heat source, and a height of the central portion is greater than at least one of a height of the upper end portion and a height of the lower end portion;
    wherein an upper slope that gradually decreases in height from bottom to top is formed on the upper end portion of the at least one functional fin, and a lower slope that gradually decreases in height from top to bottom is formed on the lower end portion of the at least one functional fin.

2. The two-phase immersion-cooling heat-dissipation structure according to claim 1, wherein a thickness of any one of the plurality of immersion-cooling fins ranges from 0.1 mm to 0.35 mm, a height of any one of the plurality of immersion-cooling fins ranges from 5 mm to 10 mm, and a gap between any two adjacent ones of the plurality of immersion-cooling fins ranges from 0.1 mm to 0.35 mm.

3. The two-phase immersion-cooling heat-dissipation structure according to claim 2, wherein a gap between at least two adjacent ones of the plurality of immersion-cooling fins is different from a gap between another two adjacent ones of the plurality of immersion-cooling fins.

4. The two-phase immersion-cooling heat-dissipation structure according to claim 1, wherein the plurality of immersion-cooling fins are made of copper or copper alloy.

5. The two-phase immersion-cooling heat-dissipation structure according to claim 1, wherein a surface roughness (Ra) of each of the plurality of immersion-cooling fins is greater than 1.5 μm.

6. The two-phase immersion-cooling heat-dissipation structure according to claim 1, further comprising: a reinforcement outer frame bonded to the immersion-cooling substrate and surrounding at least a portion of the plurality of immersion-cooling fins.

7. The two-phase immersion-cooling heat-dissipation structure according to claim 6, wherein a plurality of through holes are formed on at least one of the immersion-cooling substrate and the reinforcement outer frame, and a plurality of spring screws are threaded through the plurality of through holes, respectively.

8. The two-phase immersion-cooling heat-dissipation structure according to claim 1, further comprising: a highly thermally conductive structure attached to the second surface of the immersion-cooling substrate, such that the immersion-cooling substrate forms an indirect contact with the heat source through the highly thermally conductive structure, and wherein a vacuum airtight cavity is formed inside the highly thermally conductive structure, and the vacuum airtight cavity contains liquid.

\* \* \* \* \*